United States Patent
Yi

(10) Patent No.: US 10,054,993 B2
(45) Date of Patent: Aug. 21, 2018

(54) AIRFLOW GUIDE ASSEMBLY AND ENCLOSURE

(71) Applicant: SanDisk Technologies LLC, Plano, TX (US)

(72) Inventor: George Yi, Fremont, CA (US)

(73) Assignee: SanDisk Enterprise IP LLC, Dallas, TX (US)

(*) Notice: Subject to any disclaimer, the term of this patent is extended or adjusted under 35 U.S.C. 154(b) by 0 days.

(21) Appl. No.: 15/285,794

(22) Filed: Oct. 5, 2016

(65) Prior Publication Data

US 2018/0095508 A1   Apr. 5, 2018

(51) Int. Cl.
| | |
|---|---|
| *G06F 1/20* | (2006.01) |
| *H05K 7/20* | (2006.01) |
| *G06F 1/18* | (2006.01) |
| *H05K 7/14* | (2006.01) |

(52) U.S. Cl.
CPC .............. *G06F 1/20* (2013.01); *G06F 1/183* (2013.01); *H05K 7/20* (2013.01); *H05K 7/20009* (2013.01); *H05K 7/20136* (2013.01); *H05K 7/20145* (2013.01); *H05K 7/20154* (2013.01); *H05K 7/20163* (2013.01); *H05K 7/20172* (2013.01); *H05K 7/20209* (2013.01); *H05K 7/14* (2013.01); *H05K 7/20127* (2013.01)

(58) Field of Classification Search
None
See application file for complete search history.

(56) References Cited

U.S. PATENT DOCUMENTS

| | | |
|---|---|---|
| 3,710,199 A | 1/1973 | Cignoni, Jr. |
| 4,614,383 A | 9/1986 | Polley et al. |
| 5,196,987 A | 3/1993 | Webber et al. |
| 5,245,527 A | 9/1993 | Duff et al. |
| 6,070,742 A | 6/2000 | McAnally et al. |
| 6,071,142 A | 6/2000 | Blackman |
| 6,160,699 A | 12/2000 | Gibson et al. |
| 6,259,604 B1 | 7/2001 | Küster |
| 6,303,864 B1 | 10/2001 | Johnson et al. |
| 6,305,556 B1 | 10/2001 | Mayer |
| 6,326,547 B1 | 12/2001 | Saxby et al. |

(Continued)

OTHER PUBLICATIONS

Facebook, "Open Rack Specification V2," Revision 4, Apr. 11, 2014, 9 pages.

(Continued)

*Primary Examiner* — Dimary Lopez Cruz
*Assistant Examiner* — Zhengfu Feng
(74) *Attorney, Agent, or Firm* — Morgan, Lewis & Bockius LLP

(57) ABSTRACT

In an electronics system, an adjustable airflow guide assembly and methods of deploying it facilitate dissipating heat. The assembly includes an extendable plate having a first coupling capable of rotatably attaching the extendable plate to a chassis, a link, including a second coupling, capable of translatably attaching the link to the chassis, and a third coupling capable of rotatably attaching the link to the extendable plate. The extendable plate presents a guide to deflect airflow and is capable of being swung into multiple different fixed positions to divert airflow within the electronics system toward portions of the chassis configured with electronic components that produce heat, such as board solid state drives (BSSDs).

27 Claims, 7 Drawing Sheets

(56) References Cited

U.S. PATENT DOCUMENTS

| | | |
|---|---|---|
| 6,327,139 B1 | 12/2001 | Champion et al. |
| 6,435,354 B1 | 8/2002 | Gray et al. |
| 6,501,020 B2 | 12/2002 | Grant et al. |
| 6,523,918 B1 | 2/2003 | Baiza |
| 6,544,057 B1 | 4/2003 | Stremick et al. |
| 6,600,665 B2 | 7/2003 | Lauchner |
| 6,683,252 B2 | 1/2004 | Sobel et al. |
| 6,747,874 B2 | 6/2004 | McKinnon et al. |
| 6,767,237 B1 | 7/2004 | Shih |
| 6,805,248 B2 | 10/2004 | Champion et al. |
| 6,854,605 B2 | 2/2005 | Wrycraft |
| 6,902,069 B2 | 6/2005 | Hartman et al. |
| 6,945,504 B2 | 9/2005 | Chen et al. |
| 6,972,949 B1 | 12/2005 | Helgenberg et al. |
| 7,009,112 B1 | 3/2006 | Mead et al. |
| 7,023,708 B2 | 4/2006 | Nguyen et al. |
| 7,026,551 B2 | 4/2006 | Franz et al. |
| 7,121,412 B2 | 10/2006 | Richards et al. |
| 7,168,576 B2 | 1/2007 | Williams |
| 7,189,924 B1 | 3/2007 | Popescu et al. |
| 7,195,511 B1 | 3/2007 | Ornt et al. |
| 7,201,279 B2 | 4/2007 | Mimlitch, III |
| 7,258,583 B1 | 8/2007 | Baiza |
| 7,429,701 B1 | 9/2008 | Kushnir et al. |
| 7,472,795 B2 | 1/2009 | Dubon et al. |
| 7,473,846 B2 | 1/2009 | Doerr et al. |
| 7,554,819 B2 | 6/2009 | Chen et al. |
| 7,568,935 B1 | 8/2009 | Gonzalez et al. |
| 7,654,398 B2 | 2/2010 | Bridges et al. |
| 7,695,305 B1 | 4/2010 | Ray et al. |
| 7,850,478 B2 | 12/2010 | Lin et al. |
| 7,901,241 B1 | 3/2011 | Larkin |
| 8,045,343 B2 | 10/2011 | Fan et al. |
| 8,134,074 B2 | 3/2012 | Ong et al. |
| 8,167,146 B2 | 5/2012 | Yu et al. |
| 8,186,634 B2 | 5/2012 | Chen et al. |
| 8,231,014 B2 | 7/2012 | Chen et al. |
| 8,337,236 B2 | 12/2012 | Shu |
| 8,456,845 B2 | 6/2013 | Liu |
| 8,472,198 B2 | 6/2013 | Peng et al. |
| 8,477,491 B1 | 7/2013 | Ross et al. |
| 8,729,389 B2 | 5/2014 | Hallet et al. |
| 8,986,040 B2 | 3/2015 | Garofalo et al. |
| 9,144,174 B2 | 9/2015 | Chen et al. |
| 9,173,312 B1 | 10/2015 | Jau et al. |
| 9,210,828 B2 | 12/2015 | Liao et al. |
| 9,391,402 B2 | 7/2016 | Lin |
| 2001/0026436 A1 | 10/2001 | Tanzer et al. |
| 2003/0209361 A1 | 11/2003 | Sivertsen |
| 2003/0224717 A1* | 12/2003 | Tsai .................. H05K 7/2019 454/184 |
| 2004/0120134 A1 | 6/2004 | Nguyen et al. |
| 2006/0011380 A1 | 1/2006 | Pierce |
| 2006/0046557 A1 | 3/2006 | Pulizzi et al. |
| 2006/0113433 A1 | 6/2006 | Chen et al. |
| 2007/0291430 A1 | 12/2007 | Spitaels et al. |
| 2008/0093958 A1 | 4/2008 | Peterson |
| 2008/0264880 A1 | 10/2008 | Wagner et al. |
| 2009/0078834 A1 | 3/2009 | Chen et al. |
| 2010/0087956 A1* | 4/2010 | Regimbal ............ H05K 7/2019 700/276 |
| 2011/0100933 A1 | 5/2011 | Kitten |
| 2012/0133255 A1* | 5/2012 | Izuno ................ H05K 7/20727 312/236 |
| 2012/0162883 A1 | 6/2012 | Jai |
| 2012/0190225 A1 | 7/2012 | Bessyo et al. |
| 2012/0293932 A1 | 11/2012 | Jai |
| 2013/0039003 A1 | 2/2013 | Li et al. |
| 2013/0058028 A1 | 3/2013 | Lu et al. |
| 2013/0135792 A1 | 5/2013 | Deshayes |
| 2013/0341471 A1 | 12/2013 | Yang et al. |
| 2014/0183306 A1 | 7/2014 | Chen et al. |
| 2014/0268568 A1* | 9/2014 | Joko ................ H05K 7/20145 361/695 |
| 2014/0376870 A1 | 12/2014 | Takeuchi et al. |
| 2015/0036272 A1 | 2/2015 | Tachibana et al. |
| 2015/0098168 A1 | 4/2015 | Liang |
| 2015/0103488 A1 | 4/2015 | Tanaka |
| 2016/0037667 A1 | 2/2016 | Wu |
| 2017/0160771 A1* | 6/2017 | Albrecht .................. G06F 1/20 |

OTHER PUBLICATIONS

International Search Report and Written Opinion dated Jul. 26, 2016, received in International Patent Application No. PCT/US2016/027924, which corresponds to U.S. Appl. No. 14/688,954, 12 pages (Yi).

International Preliminary Report on Patentability dated Oct. 17, 2017, received in International Patent Application No. PCT/US2016/027924, which corresponds to U.S. Appl. No. 14/688,954, 9 pages (Yi).

* cited by examiner

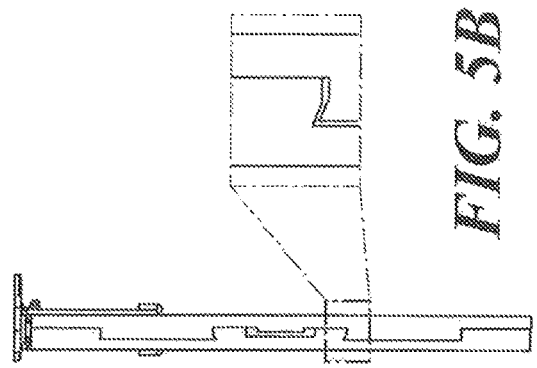
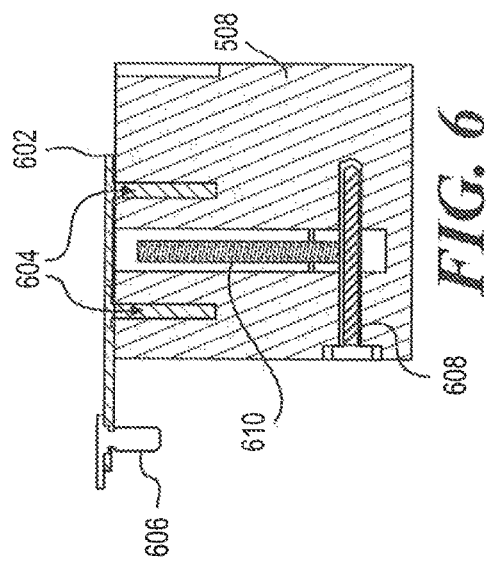
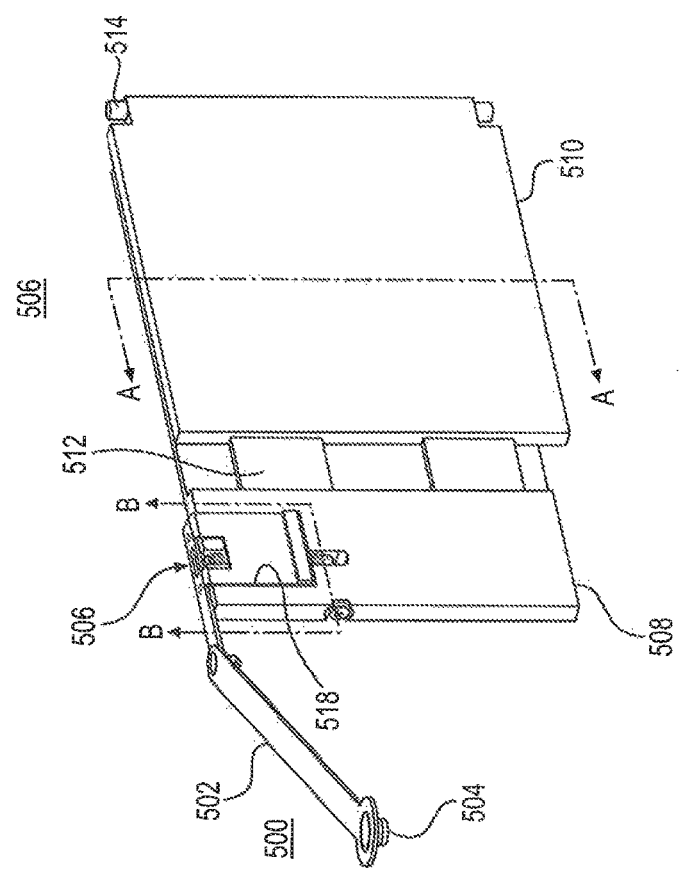

AIRFLOW GUIDE ASSEMBLY AND ENCLOSURE

TECHNICAL FIELD

The disclosed embodiments relate generally to vented enclosures with heat producing, configurable component layouts, and in particular, to airflow guides deployable in different configurations within an electronics system.

BACKGROUND

Electronic devices, including flash memory, generate heat during operation. When such devices are running within an enclosure, the generated heat can produce significant temperature increases that, if left unchecked, can lead to reduced system performance or worse, damage to or failure of devices within the enclosure.

A data storage system, for example, may package many disk drives, such as hard disk drives (HD), solid state drives (SSD) or board solid state drives (BSSD), arranged in slots within an enclosure. These products are often configured with different storage capacities based on customers' demand. A fully loaded storage product has all slots filled with the disk drives. A half loaded storage device has half of the total number of slots filled with the disk drives. Enclosures may be sold with as few as ⅛, 1/16 or even less of the slots filled by operational disk drives. Other configurable electronics systems are similarly sold with different electronic component configurations in a common enclosure Many techniques exist to remove heat from single components, such as heat sinks, cooling fans, etc. However, these techniques fall short when addressing more complex systems within enclosures. Additionally, in systems that are configurable to include different numbers of internal components, the presence or absence of components within the enclosure not only affects the amount of heat produced within the enclosure, but can also change the effectiveness of the heat reduction measures implemented for cooling the system. For example, a solid state drive enclosure that is a fully loaded has different airflow characteristics than one that is only partially loaded. The air flow in the partially loaded system may in fact bypass certain heat generating drives by instead following voids in the enclosure left by the absence of drives.

One partial solution is to install blank or dummy drives in the empty slots so that the overall airflow characteristics are the same within an electronics system regardless of the number or configuration of the operational components or drives. However, blank drives are expensive. When dozens of them are installed in a given electronics system it drives up the cost. The blank or dummy drives increase the system airflow impedance that reduces the efficiency of cooling significantly.

In light of this, it would be desirable to provide a system and method for more effectively cooling electronic components found in configurable electronics systems with multiple components, particularly those where the number of components within the system is variable and the cooling techniques change in effectiveness based on the presence or absence of components within the enclosure.

SUMMARY

According to some embodiments, there is provided an airflow guide assembly for dissipating heat. The airflow guide assembly is deployed within an enclosure housing electronic components, such as a board solid state drive (BSSD) system. The airflow guide assembly is deployed in a configurable manner to redirect air flow entering the system enclosure through inlet vents and exiting the enclosure through outlet vents. The redirected airflow takes a path within the enclosure away from empty slots or areas of low heat generation and toward operational components, such as board solid state drives (BSSD) within the enclosure, to concentrate the air flow on these heat generating components. This allows airflow cooling to be configurable, effective and also save power by reducing load on cooling fans within the enclosure.

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various embodiments are used to enable adaptive verify voltage adjustment in memory devices.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 5A is a diagram showing an exemplary airflow guide assembly, in accordance with some embodiments.

FIG. 5B is a diagram showing an exemplary technique for attaching a slide plate to swing plate, in accordance with some embodiments.

FIG. 6 is a diagram showing an exemplary compression latch assembly, in accordance with some embodiments.

Figure 1:
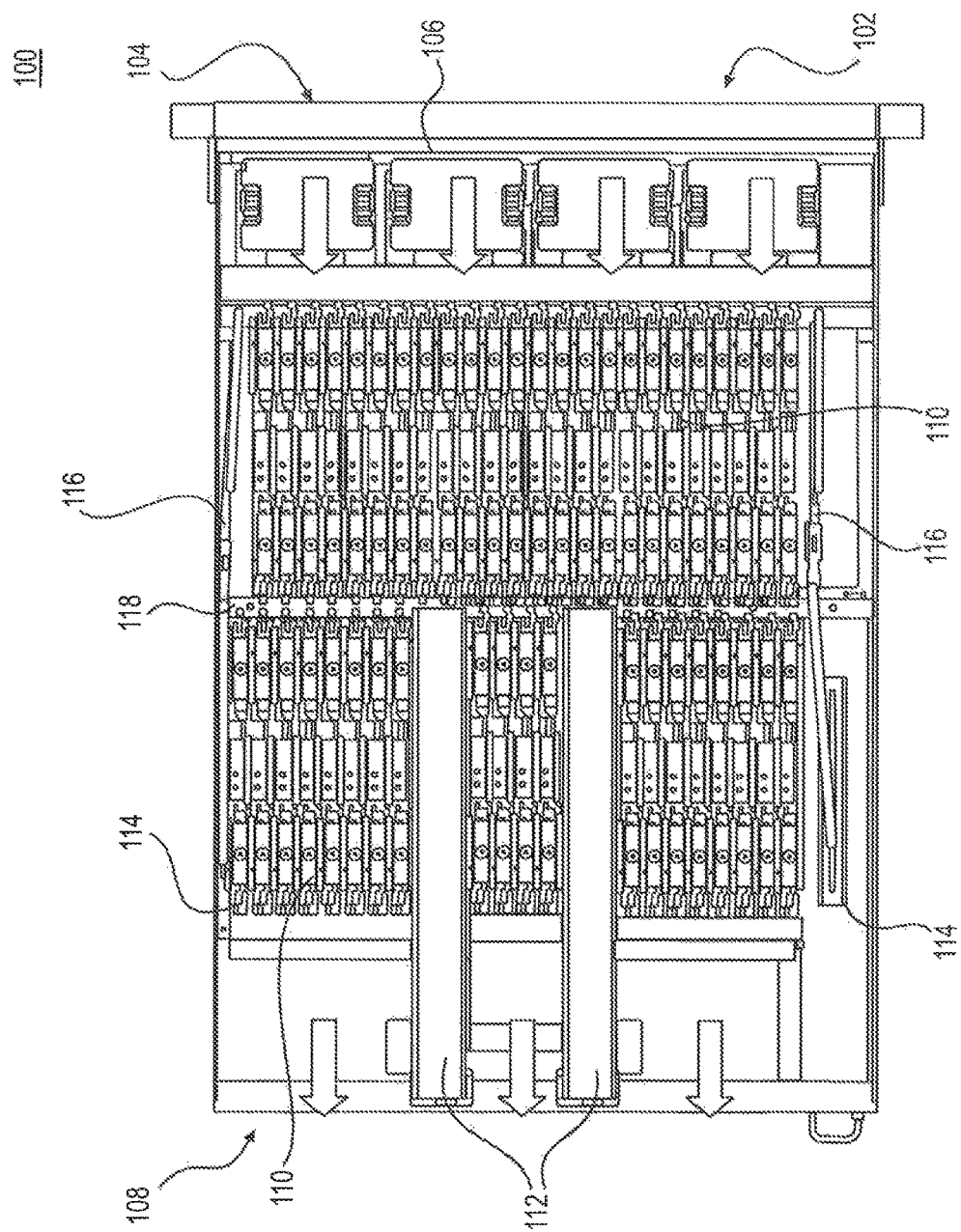
FIG. 1 is a plan view of a cross section of an illustrative electronics system that includes arrays of board solid state drives (BSSDs) that fully populate the system enclosure, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable deployment of an airflow guide assembly in a range of positions within a configurable electronic system to route airflow through the electronic system over heat generating components to enhance air flow cooling of the electronic components when they are laid out in various configurations.

More specifically, some embodiments include an adjustable airflow guide assembly for dissipating heat in an electronics system that includes an extendable plate, a link and couplings. The extendable plate includes a first coupling configured to rotatably attach the extendable plate to a chassis of an electronics system. The link includes a second coupling configured to translatably attach the link to the chassis. A third coupling is configured to rotatably attach the link to the extendable plate. The extendable plate presents a surface to deflect airflow and is capable of being swung into multiple different fixed positions to divert airflow within a system toward portions of the chassis configured with electronic components that produce heat.

In some embodiments, the third coupling is a pin that is integral with the link or a portion of the extendable plate. The pin plugs into the chassis in some embodiments to facilitate placing the airflow guide assembly into a fixed position.

In some embodiments, a compression latch assembly is coupled to the position pin that constrains the position pin to translate along an axis and apply a force to the position pin toward one or several mating receptacles within the chassis.

In some embodiments, the extendable plate includes a swing plate and a slider plate slidably coupled to the swing plate. The swing plate and the slider plate include mating grooves that slidably attach the slider to the swing plate. In some embodiments, the swing plate and the slider plate include a lock member that prevents the swing plate and the slider plate from extending beyond a predetermined position.

In some embodiments, the first coupling coupling the extendable plate to the chassis is at least one hinge positioned on the swing plate. In some embodiments the second coupling securing the link arm to the track is a roller. In some embodiments the second coupling may be a pin, screw or other protrusion that rides within a track and the track is positioned on the chassis.

In some embodiments, there is provided a method of dissipating heat in a configurable electronic system. At least one airflow guide assembly is provided, including a link, an extendable plate and a position pin that rotatably couples a first end of the extendable plate to a first end of the link. A second end of the link is inserted into a translational mount on a chassis. A second end of the extendable plate is attached to a rotational mount on the chassis. The extendable plate is selectably positioned within the chassis to divert airflow flowing through the chassis toward electronic components that produce heat.

In still other embodiments, there is provided an electronic system with configurable guided airflow. The electronic system includes a housing, at least one track and at least one airflow guide assembly, each including an extendable plate rotatably coupled at a first end to a first end of a link arm, while a second end of the extenable plate is rotatably coupled to the housing and a second end of the link arm is slidably coupled to one of the at least one respective track. Air inlet and outlet vents are positioned on the housing. The extendable plate is rotatable and extendable, and the link arm is capable of sliding along the respective track to which it is coupled to enable the airflow guide assembly to be deployed in one of several fixed positions within the housing to route airflow within the housing over heat generating components between the air inlet and outlet vents. In some embodiments, the heat generating components include one or more solid state drives or arrays of solid state drives such as board solid state drives (BSSDs).

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 illustrates a plan view of a cross section of an illustrative electronic system 100 that is fully loaded with electronic components, such as BSSDs 110. The electronic system 100 has a housing 102 that includes air inlet vents 104 and air outlet vents 108 that enable cool air to enter the housing 102, flow over the BSSDs 110, and exit the housing. The air flow over the components, such as BSSDs 110, extracts heat from the components and delivers the heat outside of the enclosure.

Referring to FIG. 1, the system 100 further includes one or more fans 106. In the illustrative embodiment shown, there are four cooling fans that when active pull air in through the air inlet vents 104 and direct the air over the internal components to the air outlet vents 108. When the system 100 is fully loaded with BSSDs 110, the BSSDs occupy almost the entire interior of the housing 102. For example, the BSSDs are positioned on both sides of the divider 118 and fill every available slot. The BSSDs 110 are also positioned between a pair of host SAS expanders (HSEs) 112 and on either side of the HSEs 112. The electronic system also includes a pair of airflow guide assemblies 116. Each airflow guide assembly 116 is translatably coupled to the housing or chassis. The translatable coupling may be accomplished by inserting one end in a track 114 on the housing or chassis. The airflow guide assembly may also be selectively attached to the divider 118 and to a hinge that that is described later. In a fully loaded configuration, a pair of airflow guide assemblies 116 are deployed such that they are positioned parallel with the airflow at or near the edges of the housing so that they do not impede the airflow across the electronic components within, which in this case are arrays of BSSDs 110 and other components.

The airflow guide assemblies 116 may be deployed in pairs as shown in FIG. 1 in some embodiments. In other embodiments, one airflow guide assembly may be used to guide the air away from portions of the enclosure to ensure efficient airflow over a desired group of components. In other embodiments, multiple airflow guide assemblies may be used to guide airflow within an electronic system in desired patterns toward electronic components that are generating heat.

Figure 2:
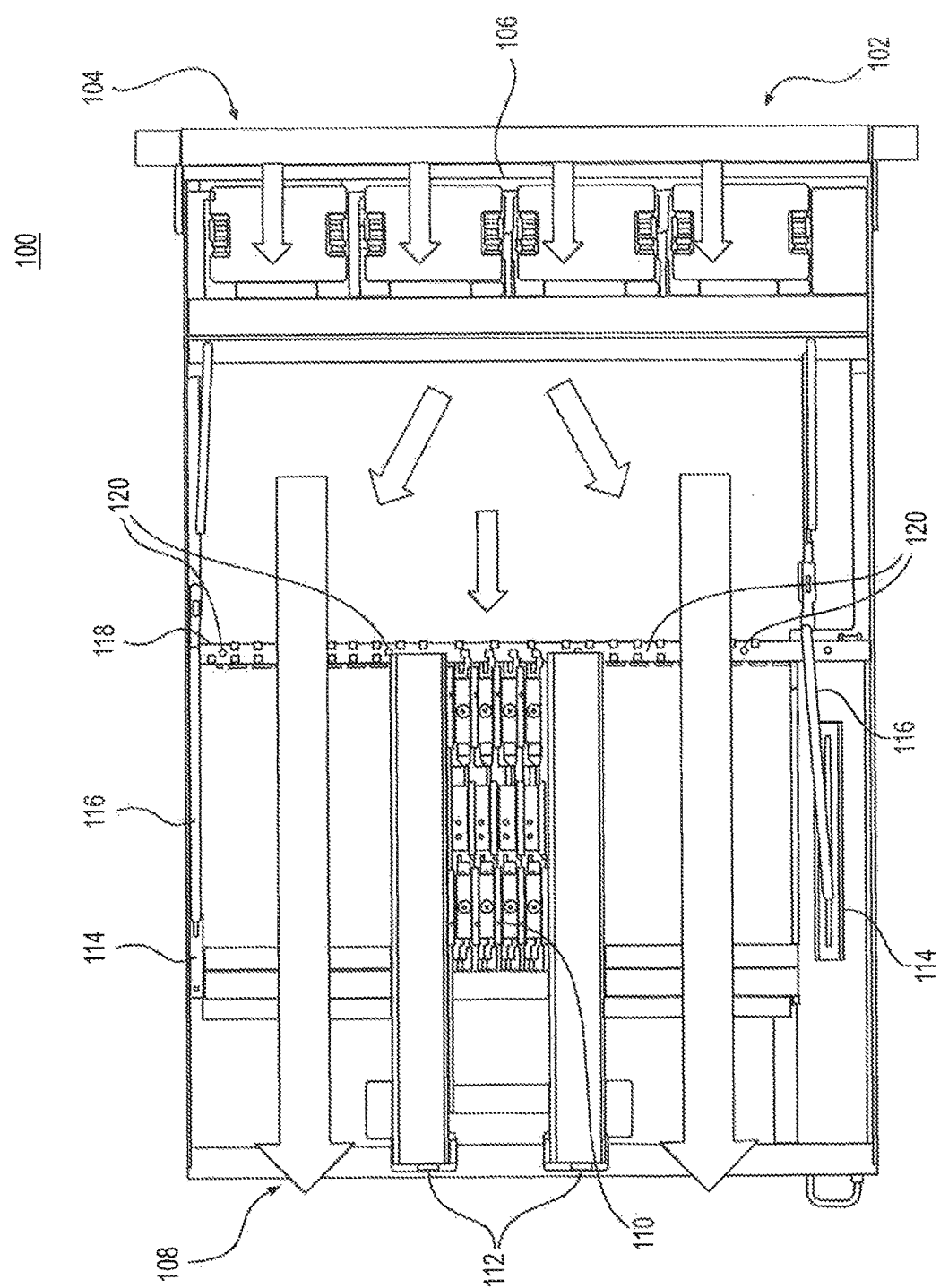
FIG. 2 is a plan view of a cross section of an illustrative electronics system that includes arrays of BSSDs that partially populate the system enclosure, with an airflow guide assembly not fully deployed, in accordance with some embodiments.

FIG. 2 illustrates a plan view of a cross section of an illustrative electronic system 100 that is only partially loaded with electronic components, such as board solid state drives (BSSDs) 110. Like the system depicted in FIG. 1, it includes a housing 102 that has at least one fan that draws air in from air inlet vents 104 and directs airflow to air outlet vents 108 to enable cool air to enter the housing 102, flow over the BSSDs 110, and exit the housing. The BSSDs 110 deployed are positioned in slots situated between the HSEs 112. This leaves unoccupied cavities within the electronic system 100 on either side of the HSEs 112 on one side of the divider 118. There is another empty cavity on the other side of the divider 118. As a result, the airflow within the system 100 largely bypasses the heat generating components 110 between the HSEs and instead largely flows from the air inlets through the system cavities and out the outlet vents. This is inefficient and ineffective from a cooling standpoint. The inefficiency can manifest itself in higher operating temperatures for the operational BSSDs within the enclosure. It also can result in higher fan speeds and consequent wasting of energy in order to compensate for misdirected airflow within the system. The electronic system 100 typically includes systems to monitor temperature of at least one of the internal components and/or internal temperature of one or more portions within the housing and to increase the fans speed to lower temperatures or to reduce fan speeds if desired operating temperatures are achieved.

Figure 3:
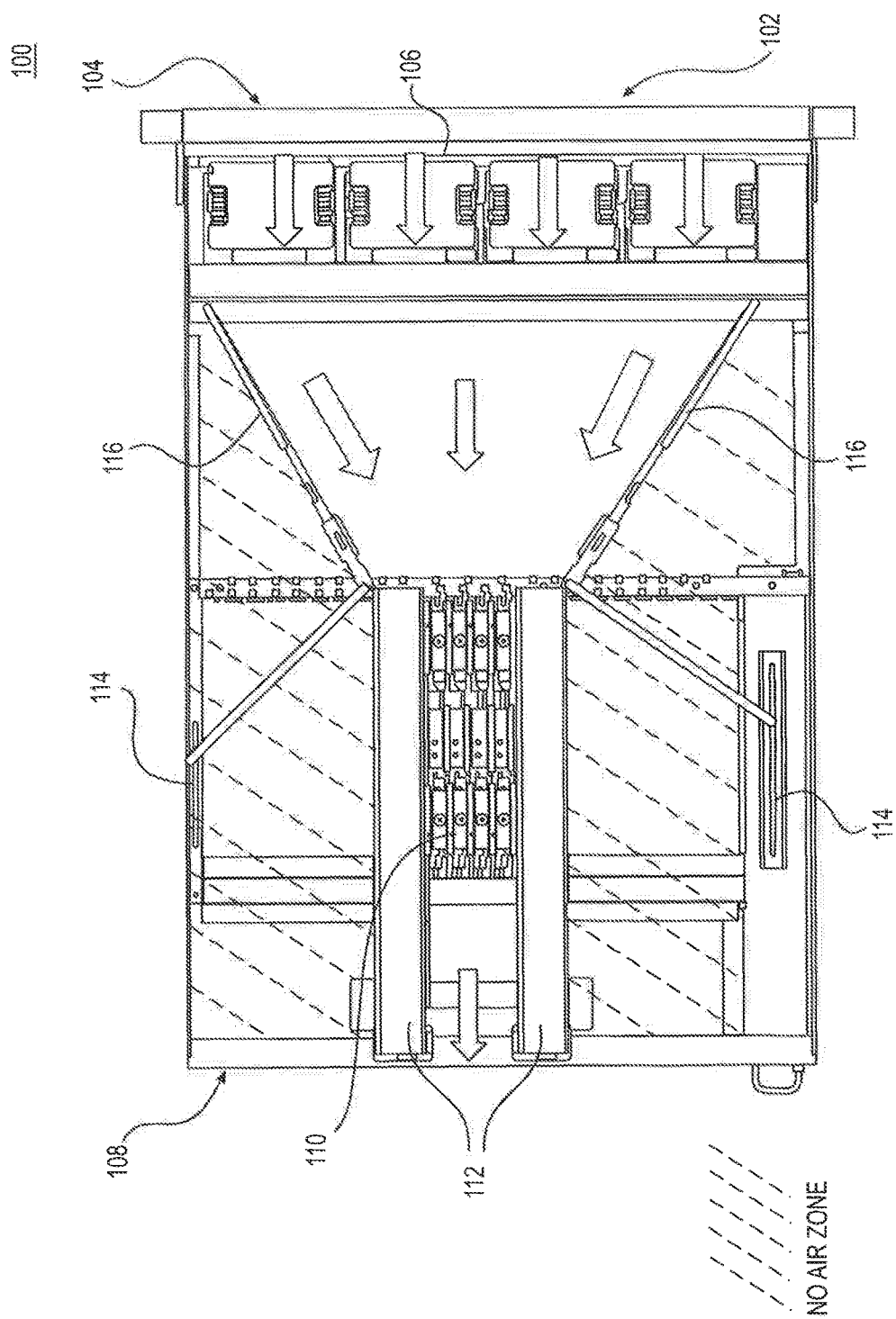
FIG. 3 is a plan view of a cross section of an illustrative electronics system that includes arrays of BSSDs that partially populate the system enclosure, with an airflow guide assembly fully deployed, in accordance with some embodiments.

It is apparent from FIG. 2 that the airflow guide assemblies 116 are positioned within the track 114 but are positioned largely parallel to the airflow on the sides of the housing 102. By contrast, FIG. 3 depicts a plan view of a cross section of the same partially loaded system 100 with the airflow guide assemblies 116 fully deployed. In the fully deployed position, the airflow guide assemblies 116 are coupled with the track 114, the divider 118, and a hinge near the air inlets to present an air baffle that direct air from the air inlets to the BSSDs 110 between the pair of HSEs within the housing 102. In some embodiments, the airflow guide assembly extends all the way from the bottom interior surface of the system 100 to the top surface to ensure that air flow is concentrated between the HSEs and is nearly entirely directed over the heat generated by the BSSD components. In other embodiments, gaps at the top or bottom of the air baffle or holes in the air baffle may be used to control airflow through the baffle to ensure a predetermined or desired air flow between the HSE and to areas behind the air baffle.

Figure 4:
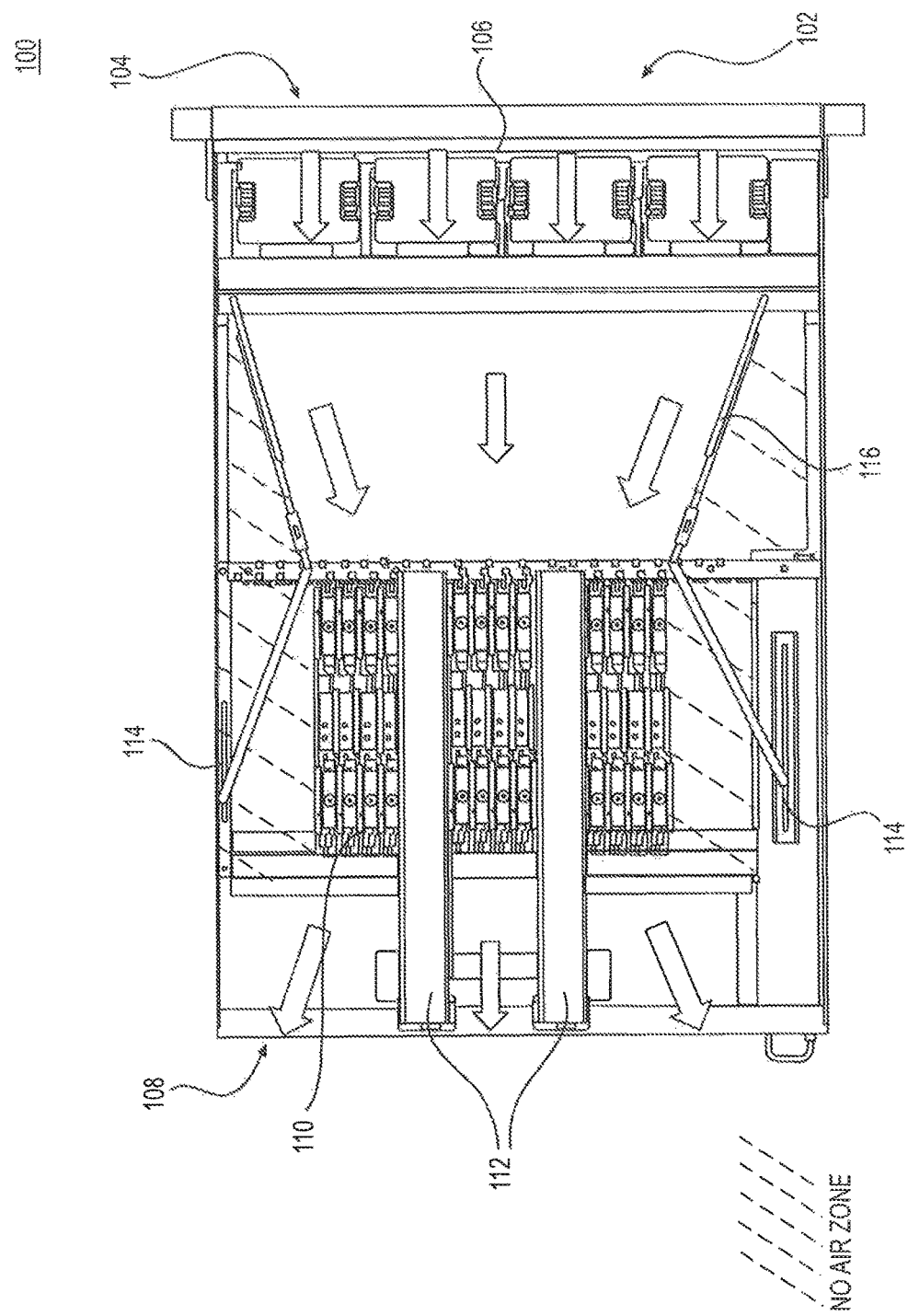
FIG. 4 is a plan view of a cross section of an illustrative electronics system that includes even more board solid state drives BSSDs that partially populate the system enclosure, with an airflow guide assembly fully deployed, in accordance with some embodiments.

FIG. 4 illustrates a plan view of a cross section of an illustrative electronic system 100 that is partially loaded with electronic components, such as board solid state drives (BSSDs) 110. The BSSDs are positioned between the pair of HSEs, and on either side of the HSEs, all on one side of the divider 118. Like the system depicted in FIG. 1, it includes a housing 102 that includes at least one fan that draws air in from air inlet vents 104 and directs it to air outlet vents 108 that enable cool air to enter the housing 102, flow over the BSSDs 110, and exit the housing. The way the BSSDs have been positioned within the electronics system 100 results in unoccupied cavities within the system on either side of the BSSDs 110 on one side of the divider 118 and another empty cavity on the other side of the divider 118. As a result, without the airflow guide assembly, the airflow within the system 100 would largely bypasses the heat generating BSSDs 110 and instead largely flow from the air inlets through the system cavities and out the outlet vents on either side of the arrays of BSSDs 110. With the airflow guide assembly deployed, it is apparent that an airflow baffle diverts the airflow from the air inlet vents to the edge of the deployment of the BSSDs.

FIG. 5A depicts an illustrative embodiment of an airflow guide assembly 116 according to some embodiments of the invention. The airflow guide assembly 116 includes a link arm 502 that is rotatably coupled to an air baffle 500 that includes a slider 508 (sometimes referred to herein as a slider plate) and a swing plate 510. The swing plate includes one or more hinges 514 that may be coupled to mating hinges on a housing, chassis or other internal portion of a system 100. The hinges 514, when engaged with mating hinges of the system 100, permit the swing plate to rotate about the hinge(s) and therefore swing into various deployed positions as shown herein. The slider 508 is a plate that engages with the swing plate and slides along a plane parallel with the swing plate that effectively allows the length of the air baffle 500 to be varied.

FIG. 5B depicts an engagement between the swing plate 510 and the slider plate 508 according to some embodiments. The slider plate and the swing plate may include one or more pairs of mating "V" guideways 520 along their adjustable length. In this manner, the slider plate 508 and swing plate 510 effectively operate as one plate that can be adjusted in length according to some embodiments. In other embodiments, there can be gaps between the plates or holes to permit air flow if or as desired in some deployments. The plates may be sized and shaped in an manner to facilitate adaptation to the housing, chassis and components expected to be within the chassis in order to achieve the desired airflow. The plates can be manufactured by extrusion, injection molding, machining or additive manufacturing. Suitable materials include plastic or metal. Similarly, each plate can be an integral unit or can have "V" guideway features attached to the plate.

The link arm 502 includes a roller 504 in some embodiments that mates with a corresponding track within the housing, chassis or system 100. The track 114 allows the roller to move within it along a predetermined path to permit optimum positioning of the air baffle 500 within the system. The track 114 may be straight, curved or include one or more curved or angular paths. The roller 504 facilitates movement of the link arm 502 along the path defined by the track 114 to permit deployment of the air baffle in different positions. The roller 504 may alternatively be a pin, bolt and mating nut, rivet, spring loaded protrusion, or other features that allows slidable engagement between the link arm and the track 114. The link arm 502 is coupled through a compression latch assembly to the air baffle 500 in some embodiments. The link arm shown is a low profile arm. However, if desired, the link arm in some embodiments is shaped to fit features within a housing or present an air baffle shape to achieve a desired airflow.

FIG. 6 depicts a cross section of a compression latch assembly 506 that is coupled to the slider plate 508 and to the link arm 502 according to some embodiments. The slider plate may include holes into which portions of the compression latch assembly are fastened in some embodiments. For example, a latch bracket 602 may include a pair of guide pins 604, in some embodiments, that extend into a pair of receiving holes within the slider plate 508. The guide pins 604 permit the latch bracket to slide parallel to the length of the holes. The latch bracket 602 may further include a pair of walls 518 as shown in FIG. 5A that slide along surfaces of the slider 508 when the latch bracket 602 is slid in the direction of the interior holes within the slider 508.

The link arm may include a position pin 606 at an end opposite the roller 504 that engages a hold within the latch bracket 602 as shown in some embodiments. The position pin may be part of the link arm 502. Alternatively, the position pin may be a bolt, screw, rivet or other protrusion that is placed through the link arm and the latch bracket to rotatably join the link arm and the latch bracket. The position pin 606 may also be sized to fit within pre-drilled holes 120 within the divider 118 to permit easy deployment of the airflow guide assembly at one of several predetermined positions. The pin may friction fit in the holes or may include a threaded portion to allow threaded attachment of the link arm and latch bracket 602 to the divider 118.

The slider plate 508 may further include a spring hole parallel to and between the pair of holes that receive the guide pins 604 as shown. The slider plate 508 may also include a fastening hole to receive set screw 608 as shown. The spring hole allows a tension spring 610 to be fastened at one end to the latch bracket 602, by a hook or other feature on the latch bracket, and allows the tension spring to be fastened at the other end to a set screw 608 within the fastening hole as shown. When the tension spring is fastened to the set screw 608 and the latch bracket it forces the latch bracket 602 against the slider plate 508.

Figure 7:
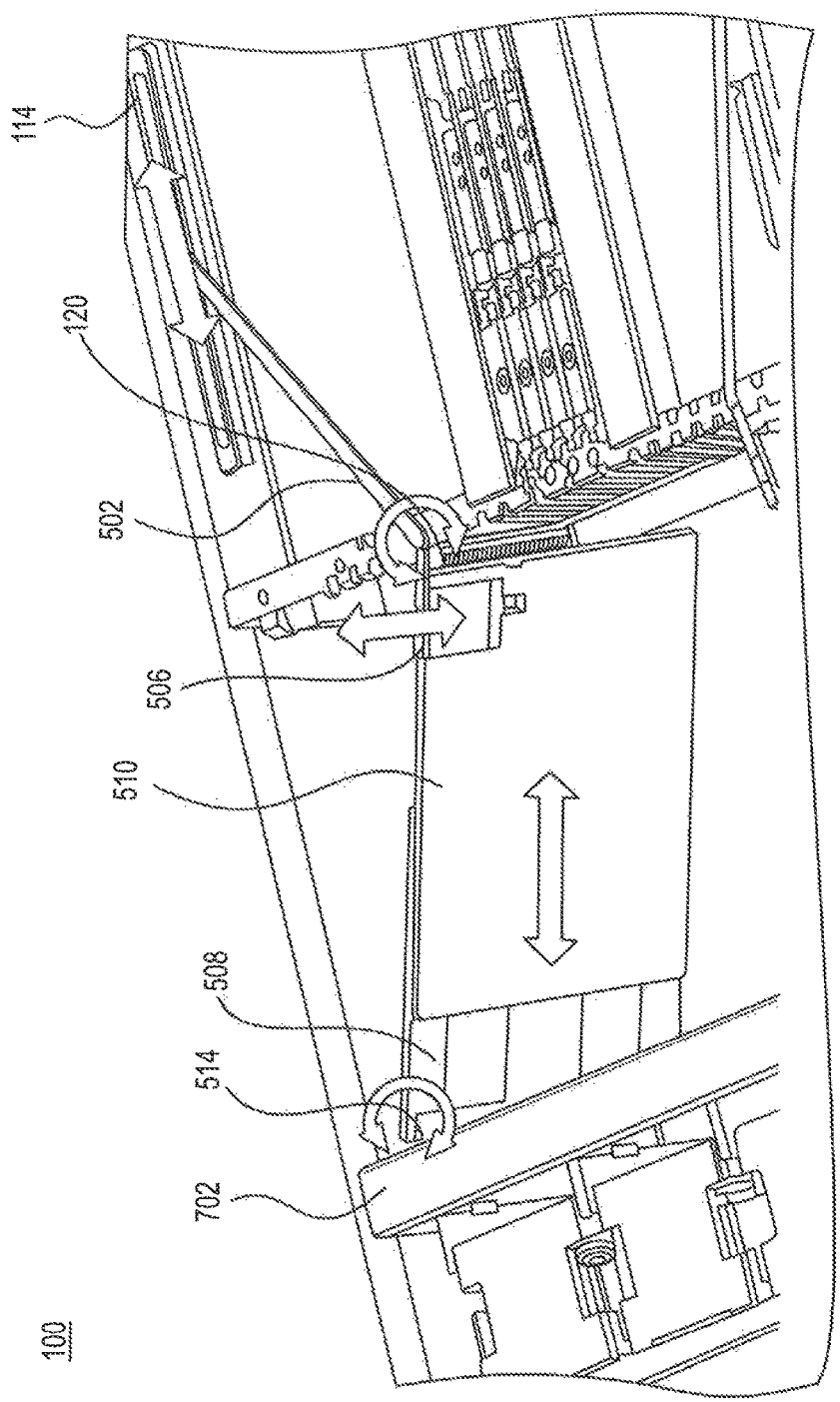
FIG. 7 is a diagram showing attachment of an airflow guide assembly within an electronic system that illustrates attachment, rotation and sliding of elements within the assembly that are moved during deployment, in accordance with some embodiments.

The latch bracket can be extended away from the slider 508 by pulling on it, which allows a user to manipulate the latch bracket to bring the position pin 606 into or out of engagement with the link arm 502 and pre-drilled holes 120 within the divider 118. In this manner, as shown in FIG. 7, when deploying an airflow guide assembly 116 fastened to a track 114 within a system 100 on one end and to a mating hinge 702 of the housing 102 (or otherwise within the system 100) at the other end, the walls 518 of the latch bracket 602 may be gripped and the air baffle 500 swung into different positions by rotating it about the hinge(s) 514. The air baffle 500 may be extended and the latch bracket may be pulled and then forced down to drive the position pin 606 into a pre-drilled hole 120 within the divider 118. As the air baffle is rotated and extended about the hinges, the link arm 502 slides along the track 114. A user or technician may therefore manipulate the airflow guide assembly into different predetermined positions as shown herein depending on how full or empty a given system 100 is with electronic components, including, for example, BSSDs 110. In some embodiments, the airflow guide assembly 116 may be guided by a motor into different deployed positions. For a given system, the BSSDs may be placed into the system by first filling, for example, the inside slots and then filling slots to the outside, if additional BSSDs are purchased or deployed, to permit the voids to be at the sides of the housing. This allows the airflow guide assemblies to be deployed on the sides of the system 100 to force airflow over the components positioned in or around the middle of the device and cool the heat generating components in an efficient manner using fans and airflow.

In some embodiments, the electronic components within the device may be filled from the outside in. If this is the case, the airflow guide assemblies may be deployed toward the center of the housing to force airflow toward the sides of the housing 102 to ensure that the airflow travels over the electronic components and removes heat. In other embodiments, components generating heat may be placed in positions that require a user or technician to place airflow baffles in predetermined positions by swinging or extending an air baffle according to the techniques described herein in order to improve cooling efficiency.

Figure 8:
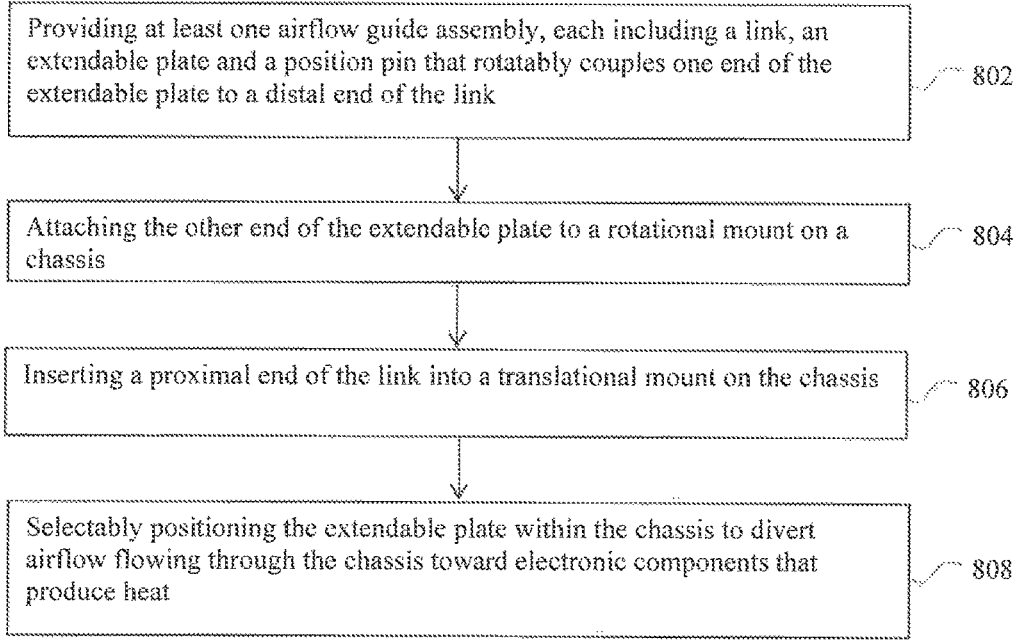
FIG. 8 illustrates a flowchart representation of a method of deploying a swingable air baffle assembly in a configurable enclosure, in accordance with some embodiments.

FIG. 8 depicts a method 800 according to some embodiments of installing an airflow guide assembly into an electronics system 100. In 802, at least one airflow guide assembly 116, each including a link, an extendable plate and a position pin that rotatably couples one end of the extendable plate to a distal end of the link is provided. In 804, the other end of the extendable plate is attached to a rotational mount on the chassis. In 806, a proximal end of the link is inserted into a translational mount on a chassis. In 808, the extendable plate is selectively positioned within the chassis or housing of the electronics system to divert airflow flowing through the chassis toward electronic components that produce heat.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications to thereby enable others skilled in the art.

What is claimed is:

1. An adjustable airflow guide assembly for dissipating heat in an electronics system, comprising:
   an extendable plate including a first coupling configured to rotatably attach the extendable plate to a chassis within the electronics system;

a link, including a second coupling configured to translatably attach the link to the chassis; and a third coupling configured to rotatably attach the link to the extendable plate;

wherein, the extendable plate presents a guide to deflect airflow within the electronics system, where the extendable plate is capable of being rotatably swung and locked into multiple different fixed positions while coupled to both the chassis and the link, and each fixed position of the multiple fixed positions diverts airflow within the electronics system toward a distinct portion of the chassis configured with electronic components that produce heat.

2. The airflow guide assembly according to claim 1, wherein the third coupling is integral with the link.

3. The airflow guide assembly according to claim 2, wherein the third coupling is positioned on the extendable plate.

4. The airflow guide assembly according to claim 1, wherein the third coupling is a position pin that is configured to attach to the chassis to lock the extendable plate in place.

5. The airflow guide assembly according to claim 4, further comprising a compression latch assembly coupled to the position pin that constrains the position pin to translate along its longitudinal axis and apply a force to the position pin toward at least one mating portion of the chassis.

6. The airflow guide assembly according to claim 1, wherein the extendable plate includes a swing plate and a slider plate slidably coupled to the swing plate.

7. The airflow guide assembly according to claim 6, wherein the swing plate and the slider plate include mating grooves that slidably attach the slider plate to the swing plate.

8. The airflow guide assembly according to claim 7, wherein at least one of the swing plate and the slider plate include a lock member that prevents the swing plate and the slider plate from extending beyond a predetermined position.

9. The airflow guide assembly according to claim 6, wherein the first coupling is at least one hinge positioned on the swing plate.

10. The airflow guide assembly according to claim 6, wherein the second coupling is a roller.

11. A method of deploying an airflow guide assembly to cool an electronics system, comprising:

providing at least one airflow guide assembly comprising a link, an extendable plate and a position pin that rotatably couples a first end of the extendable plate to a first end of the link;

inserting a second end of the link into a translational mount on a chassis within the electronics system;

attaching a second end of the extendable plate to a rotational mount fixed to the chassis; and selectably positioning the extendable plate into a fixed position of multiple fixed positions within the chassis while the extendable plate is coupled to both the chassis and the link, each fixed position of the multiple fixed positions to divert airflow toward a distinct portion of the chassis configured with electronic components that produce heat.

12. The method according to claim 11, wherein the airflow guide assembly is fixed into one of a plurality of predetermined positions by selectively inserting the position pin into at least one predetermined receptacle within the chassis.

13. The method according to claim 12, wherein the airflow guide assembly is moved into another fixed position by withdrawing and reinserting the position pin into a hole in the chassis at a different location.

14. The method according to claim 11, wherein the extendable plate includes a swing plate and a slider plate slidably coupled to the swing plate.

15. The method according to claim 14, wherein the swing plate and the slider plate include mating grooves that slidably attach the slider plate to the swing plate.

16. The method according to claim 11, wherein the rotational mount used in the attaching comprises a hinge with mating hinge portions on the extendable plate and the chassis.

17. The method according to claim 12, wherein the selectively inserting comprises deploying a compression latch to ensure constant pressure on the position pin after insertion.

18. An electronics system with configurable guided airflow, comprising:

a housing;

at least one track coupled to the housing;

at least one airflow guide assembly, each including an extendable plate and a link arm, wherein a first end of the extendable plate is rotatably coupled to a first end of the link arm, wherein a second end of the extendable plate is rotatably coupled to the housing, and wherein a second end of the link arm is slidably coupled to a respective one of the at least one track; and air inlet vents and air outlet vents positioned on the housing;

wherein the extendable plate is rotatable and extendable while coupled to both the link arm and the housing, the link arm is capable of sliding to enable the airflow guide assembly to be deployed in one of several fixed positions within the housing, and each fixed position of the several fixed positions routes airflow toward a distinct portion within the housing over heat generating components disposed between the air inlet vents and the air outlet vents within the housing.

19. The electronics system according to claim 18, further comprising:

at least one fan that forces air from the air inlet vents to the air outlet vents to create the airflow through the housing.

20. The electronics system according to claim 19, wherein the extendable plate includes a swing plate and a slider plate slidably coupled to the swing plate.

21. The electronics system according to claim 20, wherein the swing plate and the slider plate include mating grooves that slidably attach the slider plate to the swing plate.

22. The electronics system according to claim 18, wherein the heat generating components include at least one solid state drive.

23. The electronics system according to claim 18, wherein the heat generating components include at least one array of solid state drives.

24. The airflow guide assembly according to claim 1, wherein, for each fixed position of the multiple fixed positions, the second coupling of the link translatably attaches the link to a distinct corresponding position within the chassis.

25. The airflow guide assembly according to claim 1, wherein the extendable plate has a variable length, with a distinct length at each fixed position of the multiple fixed positions.

26. An adjustable airflow guide assembly for dissipating heat in an electronics system, comprising:

an extendable plate including a first coupling configured to rotatably attach the extendable plate to a chassis within the electronics system;

a link, including a second coupling configured to translatably attach the link to the chassis;

a third coupling configured to rotatably attach the link to the extendable plate, wherein the third coupling is a position pin that is configured to attach to the chassis to lock the extendable plate in place; and a compression latch assembly coupled to the position pin that constrains the position pin to translate along its longitudinal axis and apply a force to the position pin toward at least one mating portion of the chassis;

wherein, when coupled to the chassis, the extendable plate presents a guide to deflect airflow within the electronics system, where the extendable plate is capable of being swung into multiple different fixed positions to divert airflow within the electronics system toward portions of the chassis configured with electronic components that produce heat.

27. An adjustable airflow guide assembly for dissipating heat in an electronics system, comprising:

an extendable plate including a first coupling configured to rotatably attach the extendable plate to a chassis within the electronics system, and a swing plate and a slider plate slidably coupled to the swing plate, wherein the swing plate and the slider plate include mating grooves that slidably attach the slider plate to the swing plate, and at least one of the swing plate and the slider plate include a lock member that prevents the swing plate and the slider plate from extending beyond a predetermined position;

a link, including a second coupling configured to translatably attach the link to the chassis; and a third coupling configured to rotatably attach the link to the extendable plate;

wherein, when coupled to the chassis, the extendable plate presents a guide to deflect airflow within the electronics system, where the extendable plate is capable of being swung into multiple different fixed positions to divert airflow within the electronics system toward portions of the chassis configured with electronic components that produce heat.

* * * * *